United States Patent [19]

Moench

[11] 4,259,731
[45] Mar. 31, 1981

[54] QUIET ROW SELECTION CIRCUITRY

[75] Inventor: Jerry D. Moench, Austin, Tex.

[73] Assignee: Motorola, Inc., Schaumburg, Ill.

[21] Appl. No.: 94,004

[22] Filed: Nov. 14, 1979

[51] Int. Cl.³ .......................... G11C 8/00; G11C 7/02
[52] U.S. Cl. .................................... 365/206; 365/230;
307/DIG. 5
[58] Field of Search ............... 365/203, 206, 189, 230;
307/DIG. 5

[56] References Cited

U.S. PATENT DOCUMENTS

| | | | |
|---|---|---|---|
| 3,706,975 | 12/1972 | Paluck | 365/230 |
| 4,074,148 | 2/1978 | Sato | 365/230 |
| 4,074,237 | 2/1978 | Spampinato | 365/189 |
| 4,145,622 | 3/1979 | Hofmann et al. | 365/230 |

Primary Examiner—Stuart N. Hecker
Attorney, Agent, or Firm—Joe E. Barbee

[57] ABSTRACT

There is provided a quiet row select circuit for holding unselected word lines or row select lines in a memory array at a predetermined voltage potential. Transistors are used to couple each row select line to the predetermined voltage potential wherein the adjacent row select lines at least one of the adjacent select lines is always coupled to the predetermined voltage when in an unselected state. A transistor is also used to couple each of the adjacent row select lines together and this transistor is enabled whenever the adjacent row select lines are non-selected so that both row select lines are coupled together to the predetermined voltage level.

10 Claims, 2 Drawing Figures

QUIET ROW SELECTION CIRCUITRY

This invention relates, in general, to memories, and more particularly, to a quiet row select circuit useful in a semiconductor memory.

In a memory array a decoded address signal is used to select a word line, also known as a row select line. The unselected row select lines will tend to float unless they are held to ground or to some other desired potential. Allowing the row select lines to float will cause a signal to be coupled onto them when a change in potential is induced on the bit lines. The coupled signal can provide what would appear to be a readout of unselected memory cells associated with those row select lines. Since such readouts are usually spurious and destructive, information could be lost. Even if the information is not destroyed, having the row select line at some negative potential takes time to return the row select line to a desired potential prior to its being accessed.

In the past, various schemes have been used to hold the row select lines at a predetermined potential level when they are unselected. One such attempt employed a transistor coupling each row select line to a desired potential level. The transistor then required a modification to the decoder to provide a control signal for the transistor. Another attempt resulted in the use of cross-coupled transistors attached to each row select line. However, such an arrangement takes up large amounts of chip area and has transient current spikes. As higher and higher density memory arrays are being reached, availability of chip area becomes a real consideration and circuits which take up a large amount of area must be revised or eliminated. By now it should be appreciated that it would be desirable to provide a circuit which would maintain unselected row lines in a quiet condition during the entire time that they are unselected and yet which does not consume a large amount of chip area.

Accordingly, it is an object of the present invention to provide a quiet row select circuit which uses a relatively small amount of chip area and has the ability to hold all unselected row select lines at a predetermined voltage level.

Another object of the present invention is to provide a circuit which consumes a minimal amount of power while holding unselected row select lines at a predetermined voltage potential.

SUMMARY OF THE INVENTION

In carrying out the above and other objects of the present invention, there is provided, in one form thereof, a quiet row select circuit for holding unselected row select lines in a predetermined state. The row select lines, also commonly known as word lines, appear in a memory array having a plurality of such row select lines and an address decoder. The quiet row select circuit comprises a plurality of first means each coupled to one of the plurality of row select lines to controllably couple the one of the plurality of row select lines to a voltage potential node. A plurality of second means is each coupled between adjacent row select lines to controllably couple the adjacent row select lines together thereby forming pairs of row select lines which can be controllably coupled together. The second means is controlled by an output from the address decoder.

A method of providing a quiet row select line for unselected row select lines in a memory is also provided.

The subject matter which is regarded as the invention is particularly pointed out and distinctly claimed in the concluding portion of this specification. The invention itself, however, together with further objects and advantages thereof, may be better understood by referring to the following description taken in conjunction with the accompanying drawings.

DETAILED DESCRIPTION OF THE DRAWINGS

Figure 1:
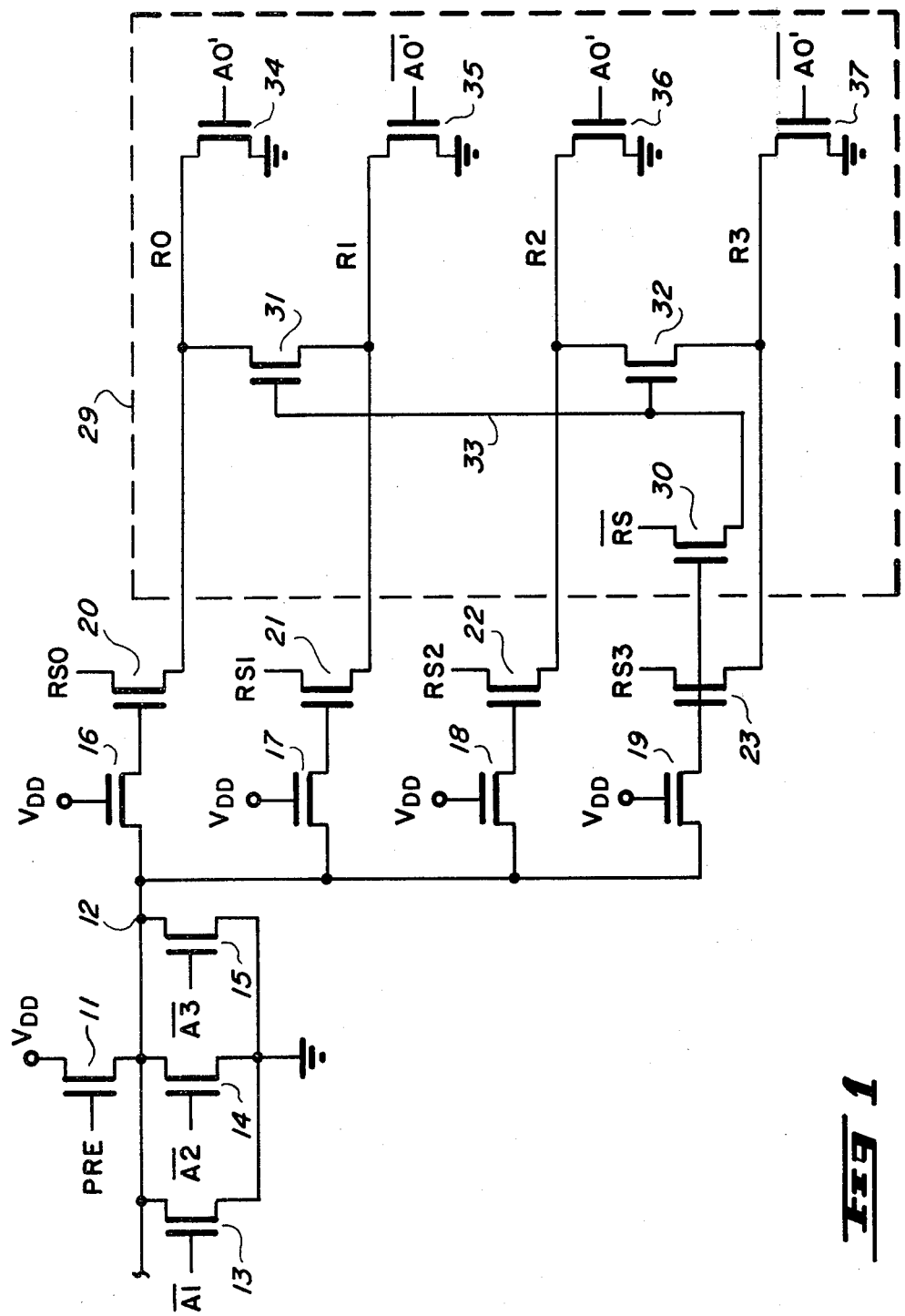
FIG. 1 is a schematic representation of an embodiment of the present invention.

FIG. 1 represents, in schematic form, a portion of a semiconductor memory. Transistor 11 along with transistors 13, 14, and 15 form a NOR circuit for decoding address signals. Transistor 11 has its drain electrode connected to a voltage terminal $V_{DD}$, its gate electrode connected to a precharge signal, and its source connected to node 12. Transistors 13, 14, and 15 are coupled from node 12 to a voltage reference potential illustrated as ground. Transistors 13 through 15 are representative of transistors in a NOR decoding circuit. Depending upon the size of the memory array there could be many more transistors than those illustrated coupled between node 12 and ground. Transistor 13 is illustrated as having address signal $\overline{A1}$ connected to its gate or control electrode. Transistor 14 is illustrated as having its gate electrode connected to address signal $\overline{A2}$, and transistor 15 is illustrated as having its gate electrode connected to address signal $\overline{A3}$. The output for the decoding NOR gate appears at node 12. Coupling transistors 16, 17, 18, 19 have one of their current carrying electrodes connected to node 12, whereas, each of the second current carrying electrodes goes to the gate electrode of another transistor. Transistor 16 couples node 12 to the gate electrode of transistor 20, transistor 17 couples node 12 to the gate electrode of transistor 21, transistor 18 couples node 12 to the gate electrode of transistor 22, and transistor 19 couples node 12 to the gate electrode of transistor 23. Transistors 16 through 19 each have their gate electrodes connected to voltage terminal $V_{DD}$. Transistors 16 through 19 provide isolation between node 12 and transistors 20 through 23, respectively, which reduces capacitance loading at the gate electrodes of transistors 20 through 23.

Transistor 20 has one electrode connected to a row select signal, RS0, and another electrode connected to row select line R0. Transistor 21 has one electrode connected to row select line, RS1, and another electrode connected to row select line R1. Transistor 22 has one electrode connected to row select signal RS2, and has its other electrode connected to row select line R2. Transistor 23 has one electrode connected to row select signal RS3 and has its other electrode connected to row select line R3. Transistors 20 through 23 provide a logic ANDing function of the signal at node 12 with the row select signal RS0 through RS3, respectively. In a preferred embodiment, the row select signal is derived by ANDing a row select signal with a coded address signal such as the sixth and seventh coded address. This derivation is not shown since it is not needed for an understanding of the invention. In fact, some memory systems have a single word line enable signal that goes to all of the word line drivers, such as transistors 20 through 23. As will be understood by those persons skilled in the art, seven addresses are needed to describe one hundred and twenty-eight locations in a memory. By using the sixth and seventh address signal to derive the row select signal then only thirty-two NOR gates are required instead of one hundred twenty-eight.

Dotted line 29 encloses four row select lines R0 through R3. In a typical 16K RAM memory there will be thirty-two such row select lines, however, for sake of simplicity only four row select lines are illustrated. Row select line R0 is terminated by transistor 34 which couples it to a predetermined voltage level, illustrated as ground. Transistor 35 couples row select line R1 to ground, transistor 36 couples row select line R2 to ground, and transistor 37 couples row select line R3 to ground. The gate electrodes of transistors 34 and 36 are connected to address signal A0', and the gate electrodes of transistors 35 and 37 are connected to address signal $\overline{A0'}$. Since transistors 34 and 35 are enabled by complementary signals one of them will always be conductive when the four row select lines within dotted line 29 are unselected. One of transistors 36 or 37 will also be enabled since the same signal that enables transistor 34 enables transistor 36 and the same signal that enables transistor 35 enables transistor 37.

Transistor 31 couples together adjacent row select lines R0 and R1. Transistor 32 couples together adjacent row select lines R2 and R3. The gate electrodes of transistors 31 and 32 are coupled to a current carrying electrode of transistor 30. The other current carrying electrode of transistor 30 is coupled to a row non-select signal $\overline{RS}$. The gate electrode of transistor 30 is coupled to node 12 by transistor 19. As can be seen, enabling of transistor 31 couples row select lines R0 and R1 together, and since at least A0' or $\overline{A0'}$ will be high, both R0 and R1 will be coupled to the voltage reference potential illustrated as ground. R2 and R3 are coupled to ground in a similar manner.

Prior to receipt of an address signal, transistor 11 is enabled by the precharge signal, PRE, applied to its gate electrode thereby charging node 12 towards $V_{DD}$. The voltage on node 12 is coupled by transistor 19 to the gate electrode of transistor 30. With transistor 30 being enabled the row non-select signal, $\overline{RS}$, can be coupled to line 33. If an address signal comes along and enables one of the pull down transistors 13, 14, or 15, then node 12 will be pulled towards ground. With node 12 being held low, transistor 30 will not be enabled and the positive $\overline{RS}$ signal coupled to line 33 will remain on line 33 thereby maintaining transistors 31 and 32 in a conductive state. Since one of transistors 34 or 35 and one of transistors 36 or 37 is conductive then all four row select lines will be held at a predetermined voltage potential such as ground.

In some cases, transistor 30 may cause loading effects on the gate electrode of transistor 23, and in such cases a capacitor added from the gate electrode of transistor 23 to its source will overcome such loading effects.

Figure 2:
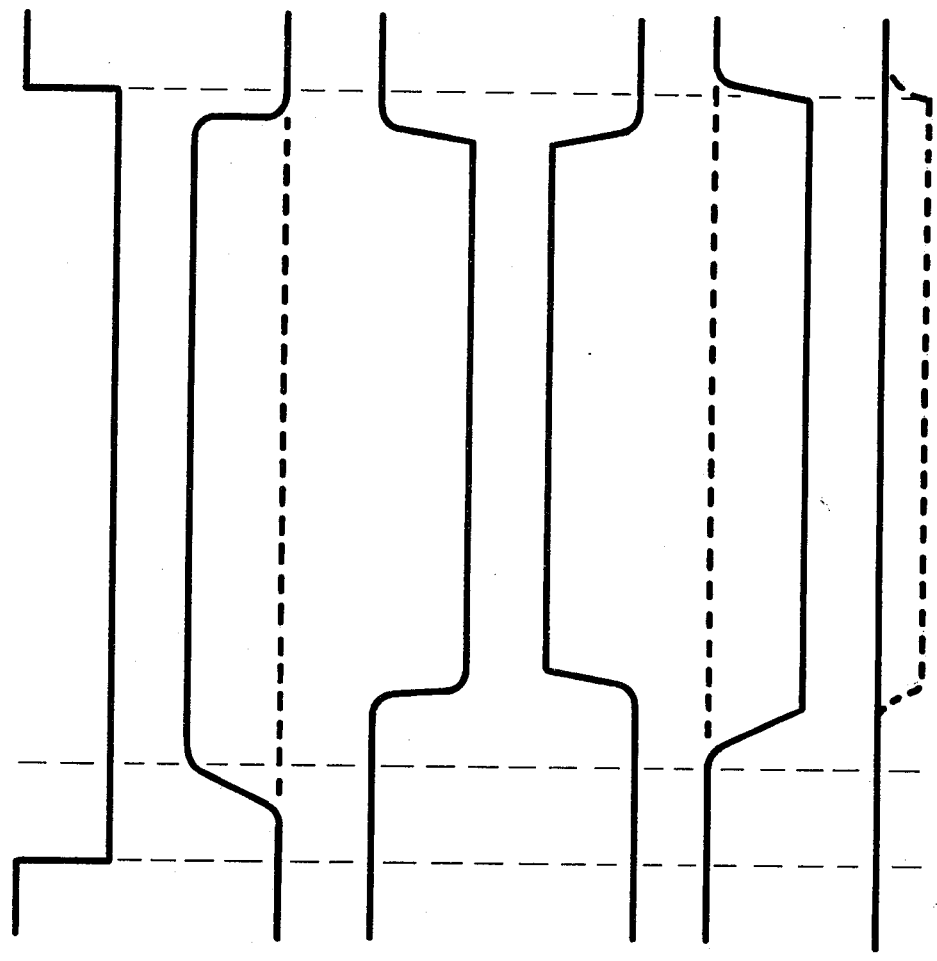
FIG. 2 is a representation of some of the timing signals helpful in understanding the operation of the circuit of FIG. 1.

Referring now to FIG. 2, it will be noted that as the precharge signal, PRE, is in a high state the address signals illustrated as A in the second waveform will be low. Then as precharge signal, PRE, goes low the addresses will be present and depending upon the particular word line or row select line chosen the address signals represented by the waveform label $\overline{A}$ can either be low (dotted) or high (solid line). After the address signals are present the row select signal will also be present. A third waveform, $\overline{RS}$, illustrates row non-select signal $\overline{RS}$ while the fourth waveform, RS, illustrates row select signals RS0 through RS3. A fifth waveform labelled 12 represents the voltage time relationship of the signal at node 12. This signal will be approximately one threshold less than $V_{DD}$ when it is in a high state. If one of the row select lines, shown within dotted line 29, is chosen then the voltage at node 12 will remain at a high level. When the NOR gate decoder is not decoding a selected signal then of course node 12 is pulled to ground. The bottom waveform, 33, represents the voltage-time relationship of the signal on line 33. This signal will be approximately $V_{DD}$ minus two thresholds or will be at ground (as illustrated by the dotted line) when transistor 30 is enabled and $\overline{RS}$ is low. If the NOR gate decoder represented by transistors 11, 13, 14, and 15 is decoding a signal that will select one of the four row select lines within dotted line 29 then node 12 stays high (as illustrated by the dotted line portion) maintaining transistor 30 in an enabled condition which will cause line 33 to be pulled low when $\overline{RS}$ goes low. Thus in this case, row select signals RS0, RS1, RS2, and RS3 control the grounding or selecting of row lines R0, R1, R2, and R3, respectively.

It should be noted that the gate electrode of transistor 30 could be connected directly to node 12 if circuit layout constraints permit such a connection. Such an arrangement would result in similar circuit operation.

By now it should be appreciated that there has been provided a quiet row select circuit which is very effective in maintaining the unselected row select lines at a predetermined voltage potential without the addition of very many transistors. In addition the transistors added use a minimum amount of power and chip area.

I claim:

1. A quiet row select circuit for use in a memory array having a decoder and a plurality of row select lines, the decoder providing an output, comprising: a first transistor coupled from each of the plurality of row select lines to a reference potential, each of the first transistors having a control electrode wherein adjacent first transistors have complementary address signals coupled to their control electrodes; a plurality of second transistors each coupled between two of the row select lines in a manner so that one of the plurality of second transistors is coupled between a first and a second row select line of the plurality of row select lines and another of the plurality of second transistors is coupled between a third and a fourth row select line of the plurality of row select lines and so forth with the remainder of the plurality of second transistors; and control means to controllably enable the plurality of second transistors, the control means enabling the second transistors when the associated row select lines are not selected thereby holding the row select lines in a quiet state, the control means being coupled to the output of the decoder.

2. A quiet row select circuit for keeping unselected row lines in a predetermined state while selected row lines are being enabled, comprising: first means coupled to the row lines for enabling the row lines when the row lines are selected, the first means providing an enabling signal when a row line is being selected and providing a complementary signal when a row line is unselected; a plurality of second means each connected to each row line for controllably coupling each row line to a voltage potential node, each adjacent second means being enabled by an address signal or its complement so that every other row select line can be coupled to the voltage potential node when unselected; and a plurality of third means each coupled between adjacent row lines, each third means being controlled by the first means so that the complementary signal can enable the third means to couple the adjacent row lines together to thereby permit one of the enabled second means to couple the adjacent row lines to the voltage potential node.

3. The row select circuit of claim 2 wherein the first means is an address decoder, and the plurality of second means are field effect transistors.

4. The row select circuit of claim 2 wherein the third means is a plurality of field effect transistors, each field effect transistor coupling two adjacent row lines together and including at least one field effect transistor for coupling a control signal to the coupling field effect transistors.

5. For use in a memory array, a quiet row select circuit for holding unselected row select lines in a predetermined state, the memory array having a plurality of row select lines and an address decoder, the address decoder providing an output for enabling a row select means, the row select means providing an output which is coupled to the row select lines, the quiet row select circuit comprising: a plurality of first means each coupled to one of the plurality of row select lines to controllably couple the one of the plurality of row select lines to a voltage potential node; and a plurality of second means each coupled between adjacent row select lines for controllably coupling the adjacent row select lines together thereby forming pairs of row select lines which can be controllably coupled together, the second means being controlled by the output of the address decoder.

6. The quiet row select circuit of claim 5 wherein the voltage potential node is a voltage reference node.

7. A method of providing a quiet row select line for unselected row select lines in a memory, comprising: controllably coupling each row select line to a predetermined voltage potential wherein adjacent row select lines are controllably coupled by complementary signals; controllably coupling adjacent row select lines together by a coupling means; coupling a non-select signal to the coupling means to enable the coupling means when an associated row select line is unselected.

8. A quiet row select circuit for holding a plurality of unselected row select lines at a predetermined voltage potential in a memory array having a plurality of row select lines when at least one row select line is being selected, the memory array having a decoder providing a decoded output from a NOR gate, a first ANDing means coupled to the output of the NOR gate and also receiving a row select signal to be ANDed with the output of the NOR gate, comprising: a plurality of first transistors each having a first, a second and a control electrode, the first electrode being coupled to a row select line and the second electrode being coupled to a predetermined voltage potential, and the control electrode being coupled to an address signal such that for every other control electrode one will be coupled to the address signal and the other will be coupled to a complement of the address signal; a plurality of second transistors having a first, a second and a control electrode, the first electrode of one of the second transistors being coupled to a first row select line and the second electrode of the one of the second transistors being coupled to an adjacent row select line, and the first electrode of another of the second transistors being coupled to a third row select line and the second electrode of the another of the second transistors being coupled to an adjacent fourth row select line, and a second ANDing means coupled to the output of the NOR gate and coupled to a non-select row select signal to AND the non-select signal and the output of the NOR gate, the second ANDing means providing an output coupled to the control electrodes of the second transistors.

9. The quiet row select circuit of claim 8 wherein the second ANDing means is a transistor having a first, a second and a control electrode, the first electrode is coupled to the non-select row select signal and the second electrode provides the output and the control electrode is coupled to the output of the NOR gate.

10. The quiet row select circuit of claim 8 wherein the transistors are field effect transistors.

* * * * *